US012690203B2

(12) United States Patent　　　　　(10) Patent No.:　US 12,690,203 B2
Mazzillo et al.　　　　　　　　　　　(45) Date of Patent:　　　Jul. 21, 2026

(54) MERGED-PIN SCHOTTKY (MPS) DIODE HAVING A DOPED REGION SURROUNDING A PLURALITY OF WELLS, AND A METHOD FOR MANUFACTURING THE SAME

(71) Applicant: NEXPERIA B.V., Nijmegen (NL)

(72) Inventors: Massimo Cataldo Mazzillo, Nijmegen (NL); Sönke Habenicht, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 427 days.

(21) Appl. No.: 18/467,251

(22) Filed: Sep. 14, 2023

(65) Prior Publication Data

US 2024/0097047 A1　　Mar. 21, 2024

(30) Foreign Application Priority Data

Sep. 15, 2022　(EP) ..................................... 22195850

(51) Int. Cl.
　　*H10D 8/60*　　　(2025.01)
　　*H10D 8/01*　　　(2025.01)
　　*H10D 62/10*　　(2025.01)
　　*H10D 62/60*　　(2025.01)
(52) U.S. Cl.
　　CPC .............. *H10D 8/60* (2025.01); *H10D 8/051* (2025.01); *H10D 62/107* (2025.01); *H10D 62/60* (2025.01)
(58) Field of Classification Search
　　CPC ............ H10D 8/60; H10D 8/051; H10D 8/50; H10D 62/107; H10D 62/60; H10D 62/10; H10D 62/106; H10D 62/124
　　See application file for complete search history.

(56) References Cited

U.S. PATENT DOCUMENTS

| | | | |
|---|---|---|---|
| 9,991,399 B2 * | 6/2018 | Mieczkowski | .......... H10D 8/60 |
| 2016/0300960 A1 * | 10/2016 | Miyake | ................ H10D 62/105 |
| 2017/0256657 A1 | 9/2017 | Niwa et al. | |
| 2018/0047855 A1 * | 2/2018 | Yasui | ........................ H10D 8/60 |
| 2021/0242307 A1 | 8/2021 | Sundaresan et al. | |
| 2022/0028979 A1 * | 1/2022 | Rascuna | .................. H10D 8/60 |

FOREIGN PATENT DOCUMENTS

| | | |
|---|---|---|
| EP | 3945607 A1 | 2/2022 |
| JP | 6632910 B2 | 1/2020 |

* cited by examiner

*Primary Examiner* — Wael M Fahmy
*Assistant Examiner* — Tiberiu Dan Onuta
(74) *Attorney, Agent, or Firm* — Ruggiero McAllister & McMahon LLC

(57)　　　　　　　　ABSTRACT

An MPS diode and a manufacturing method is provided. The diode includes a semiconductor body including an active area and an adjacent termination area, the active area includes a drift region of a first conductivity type, and a plurality of wells of a second type different from the first conductivity type, the wells being mutually spaced apart, each well forming a respective PN-junction with the drift region. The diode further includes a metal layer assembly arranged on a surface of the semiconductor body and at least one metal layer, the metal layer assembly forming a plurality of Schottky contacts together with the drift region and a plurality of respective Ohmic contacts with the wells. The drift region includes a doped region surrounding each of the wells and having a higher dopant concentration than a remainder of the drift region, and the doped region is spaced apart from the termination area.

20 Claims, 3 Drawing Sheets

MERGED-PIN SCHOTTKY (MPS) DIODE HAVING A DOPED REGION SURROUNDING A PLURALITY OF WELLS, AND A METHOD FOR MANUFACTURING THE SAME

CROSS-REFERENCE TO RELATED APPLICATIONS

This application claims the benefit under 35 U.S.C. § 119(a) of European Application No. 22195850.7 filed Sep. 15, 2022, the contents of which are incorporated by reference herein in their entirety.

BACKGROUND

1. Field of the Disclosure

Aspects of the present disclosure generally relate to an MPS diode and a method for manufacturing such an MPS diode.

2. Description of the Related Art

A cross-sectional view of a Merged-PiN Schottky (MPS) diode 100 known in the art is shown in FIG. 1. MPS diode 100 comprises a substrate 101 and an epitaxial layer 102 arranged on said substrate 101, which together form a semiconductor body. Epitaxial layer 102 comprises a drift region 103 and a plurality of wells 104. Drift region 103 is of a first conductivity type, i.e., drift region 103 has one of an n-type doping and p-type doping. Wells 104 are of a second conductivity type different from the first conductivity type, i.e., an opposite conductivity type to drift region 103.

MPS diode 100 further comprises a metal layer assembly arranged on the semiconductor body. In this example, the metal layer assembly comprises a first metal layer 105a that is brought into contact with drift region 103 and wells 104. First metal layer 105a forms a plurality of Schottky contacts with drift region 103, and a plurality of Ohmic contacts with wells 104. Metal layer assembly may include a second metal layer 105b which is arranged on first metal layer 105a and may form a first terminal of MPS diode 100 that provides external electrical access thereto. Furthermore, a contact 106 is arranged on substrate 101 and may form a second terminal of MPS diode 100 that provides external electrical access thereto.

Wells 104 and drift region 103 are included in an active area of the semiconductor body. A termination area 108 may be provided adjacent to the active area that can accommodate a high electric field to prevent premature breakdown from occurring along an edge or periphery of the active area. The metal layer assembly may be electrically insulated from the termination area, for example by an insulating layer 107 such as an oxide layer. Further layers not shown in FIG. 1 may be arranged, such as passivation layers, as appreciated by the skilled person.

Wells 104 form respective PN junctions with drift region 103. Depending on a forward voltage applied to the first and second terminal, MPS diode 100 may be operable in several modes. At lower voltages, MPS diode 100 may operate in a first mode, a depletion region of said PN junctions extends between adjacent wells, thereby preventing or substantially limiting a Schottky current from flowing from first metal layer 105a towards substrate 101. At higher voltages, MPS diode 100 may operate in a second mode, in which the depletion region of said PN junctions becomes smaller, thereby enabling a Schottky current to flow from first metal layer 105a towards substrate 101.

Breakdown may occur in MPS diode 100 under reverse bias conditions when the voltage applied to MPS diode 100 causes the electric field in MPS diode 100 to exceed a critical level. As a result of the relatively high electric field in this condition, degradation effects may occur, for example produced by power dissipation leading to a temperature increase. This degradation can have short-term effects such as direct failure of the device, and long-term effects such as reduced lifetime. Therefore, there is a need for an MPS diode in which degradation effects due to breakdown can be prevented or substantially mitigated.

Other examples of MPS diodes known in the art are disclosed in JP663291062, US2018/047855A1, US2021/242307A1, EP3945607A1, and US2017/256657A1.

SUMMARY

Aspects of the present disclosure relate to an MPS diode in which the abovementioned drawback(s) do not occur, or hardly so.

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an aspect of the present disclosure, an MPS diode is provided. The MPS diode comprises a semiconductor body including an active area and a termination area adjacent to the active area. The active area comprises a drift region of a first conductivity type, and a plurality of wells of a second conductivity type different from the first conductivity type, the plurality of wells being mutually spaced apart, each well forming a respective PN-junction with the drift region. The MPS diode further comprises a metal layer assembly arranged on a surface of the semiconductor body and comprising at least one metal layer, the metal layer assembly forming a plurality of Schottky contacts together with the drift region and a plurality of respective Ohmic contacts with the plurality of wells. The drift region comprises a doped region surrounding each of the plurality of wells and having a higher dopant concentration than a remainder of the drift region, wherein the doped region is spaced apart from the termination area.

The Applicant has found that in the typical MPS diode, breakdown may occur in the termination area. However, the termination area is a relatively small portion of the device and, in the case of breakdown, a relatively large current may flow through said small portion.

In the MPS diode in accordance with the present disclosure as described above, this effect can be mitigated by introducing the doped region such that excessive power dissipation due to temporarily operating in breakdown can be dissipated over a larger area, in particular a substantial portion of the active area or even the whole active area as opposed to only the termination region. In other words, premature breakdown in the termination area can be prevented or limited. This can lead to less severe degradation effects produced by temperature increase and thus may lead to higher ruggedness and longer lifetime of the MPS diode.

More in particular, the termination area may be subjected to a relatively high electrical field during operation, for example due to field crowding. By spacing apart the doped region from the termination area, extension of the electrical field in the active area to the termination area is prevented or limited. This allows increasing the electrical field in the active area for the purposes of more controlled breakdown that is spread across the active area, without or with limited effect on the behavior of the termination area.

The plurality of wells may extend from the surface to a first depth into the semiconductor body and the doped region may extend from the surface to a second depth into the semiconductor body. The second depth may be at least 20% larger than the first depth, preferably at least 50% greater. The relative depth of the doped region with respect to the plurality of wells further ensures that the depletion region corresponding to a junction between the drift region and the plurality of wells is mostly confined or concentrated inside the doped region such as to further prevent or limit break-down from occurring outside the active area.

The termination area may comprise a termination region of the second conductivity type extending from the surface to a third depth in the semiconductor body. The second depth may be equal to or greater than the third depth. By having the first depth equal to or greater than the third depth, excessive constriction of potential lines at an intersection between the active area and the termination area can be limited, which may otherwise result in a higher probability of breakdown occurring outside of the active area.

A dopant concentration of the plurality of wells may be at least 10 times greater than a dopant concentration of the termination region, preferably at least 20 times greater. By having a higher dopant concentration in the plurality of wells compared to the termination region, the electrical field in the active area with respect to the electrical field in the termination area can be further increased.

From the surface in the direction perpendicular to the surface, the dopant concentration of the doped region may increase. In other words, the doped region may have a vertical dopant profile that increases from a surface of the semiconductor body towards the first depth to which the doped region extends. By forming the doped region with a vertical dopant profile, leakage currents in reverse bias can be minimized.

In a further embodiment, the doped region may include a substantially uniformly doped upper region and a substantially uniformly doped lower region below said upper region. The lower region may extend from between 70% and 90% of a depth of the plurality of wells to the first depth. For example, a dopant concentration of the lower region may be at least two times higher than a dopant concentration of the upper region, or at least three times higher. The Applicant has found that this configuration is highly suitable for mitigating leakage currents in reverse bias, as well as localizing a relatively higher electrical field at the bottom of the plurality of wells which can also effectively increase the likelihood for breakdown to occur in the active area rather than outside of the active area.

The doped region may further include one or more substantially uniformly doped middle regions arranged between the upper region and the lower region and having a dopant concentration in between that of the upper region and the lower region.

The doped region may be spaced apart from the termi-nation area and may extend laterally in at most 98% of the active area, preferably at most 95%, and more preferably at least 80%. In doing so, a substantial portion of the active area can contribute to conducting the current generated due to breakdown in a breakdown event.

The doped region may comprise a central region and an outer region laterally adjacent to the inner region, wherein the outer region has a lower dopant concentration than the inner region, the outer region preferably having a sloped dopant profile in an outward direction from a center of the doped region. In other words, the doped region may have a lateral dopant profile at least near an edge of the active area with respect to the center of the doped region. By smoothing a transition of dopant concentration from the doped region to a remainder of the drift region towards the termination area, excessive constriction of potential lines at an intersec-tion between the active area and the termination area can be reduced, increasing the likelihood of breakdown occurring in the active area.

A spacing between wells in each pair of adjacently arranged wells among the plurality of wells and the dopant concentration of the doped region may be selected such that, at breakdown, an electrical field strength at an interface between the metal layer assembly and the drift region is below 70% and preferably below 50% of an electrical field strength at the PN junctions between the plurality of wells and the drift region. In doing so, breakdown at the Schottky junction, that is, the interface between the doped region and the metal layer assembly, is prevented or substantially limited and can instead be substantially concentrated at the interfaces between the wells and the drift region. Accord-ingly, the robustness and lifetime of the MPS diode can be improved. In an example, the drift region may have a dopant concentration of about 1e16 cm$^{-3}$, the doped region may have a dopant concentration between 3e16-6e16 cm$^{-3}$, and the plurality of wells may have a dopant concentration of about 1e18 cm$^{-3}$ and a relative spacing between 2.5-3.5 µm.

The semiconductor body may comprise a substrate and an epitaxial layer arranged on said substrate. The active area and the termination area may be arranged in the epitaxial layer.

The metal layer assembly may form a first terminal of the MPS diode, and the MPS diode may further comprise a contact arranged on the substrate, said contact forming a second terminal of the MPS diode.

The dopant concentration of the doped region may be at least two times and preferably at least three times greater than the dopant concentration of a remainder of the drift region. Within the context of the present disclosure, the remainder of the drift region may correspond to a portion of the drift region extending between the doped region and the substrate.

The plurality of wells may be formed as parallel strips or as concentric shapes, such as elliptical or polygonal shapes.

Each of the plurality of wells may further comprising a subregion at the surface of the semiconductor body, said subregion having a higher dopant concentration than a remainder of said well for enabling an Ohmic contact with the metal layer assembly and/or said subregion.

According to another aspect of the present disclosure, a method for manufacturing an MPS diode is provided. The method comprises providing a semiconductor body includ-ing an active area and a termination area adjacent to the active area, wherein the active area comprises a drift region of a first conductivity type; forming a doped region in the drift region, said doped region having a higher dopant concentration than a remainder of the drift region, wherein the doped region is spaced apart from the termination area; forming a plurality of wells of a second conductivity type different from the first conductivity type in the doped region, the plurality of wells being mutually spaced apart, each well forming a respective PN-junction with the drift region; and arranging a metal layer assembly on the surface, said metal layer assembly comprising at least one metal layer, wherein said metal layer assembly forms a plurality of Schottky contacts together with the drift region and a plurality of respective Ohmic contacts with the plurality of wells.

BRIEF DESCRIPTION OF DRAWINGS

Next, the present disclosure will be described in more detail with reference to the appended drawings, wherein.

Figure 1:
FIG. 1 is a cross-sectional view of an MPS diode known in the art.
Figure 1:
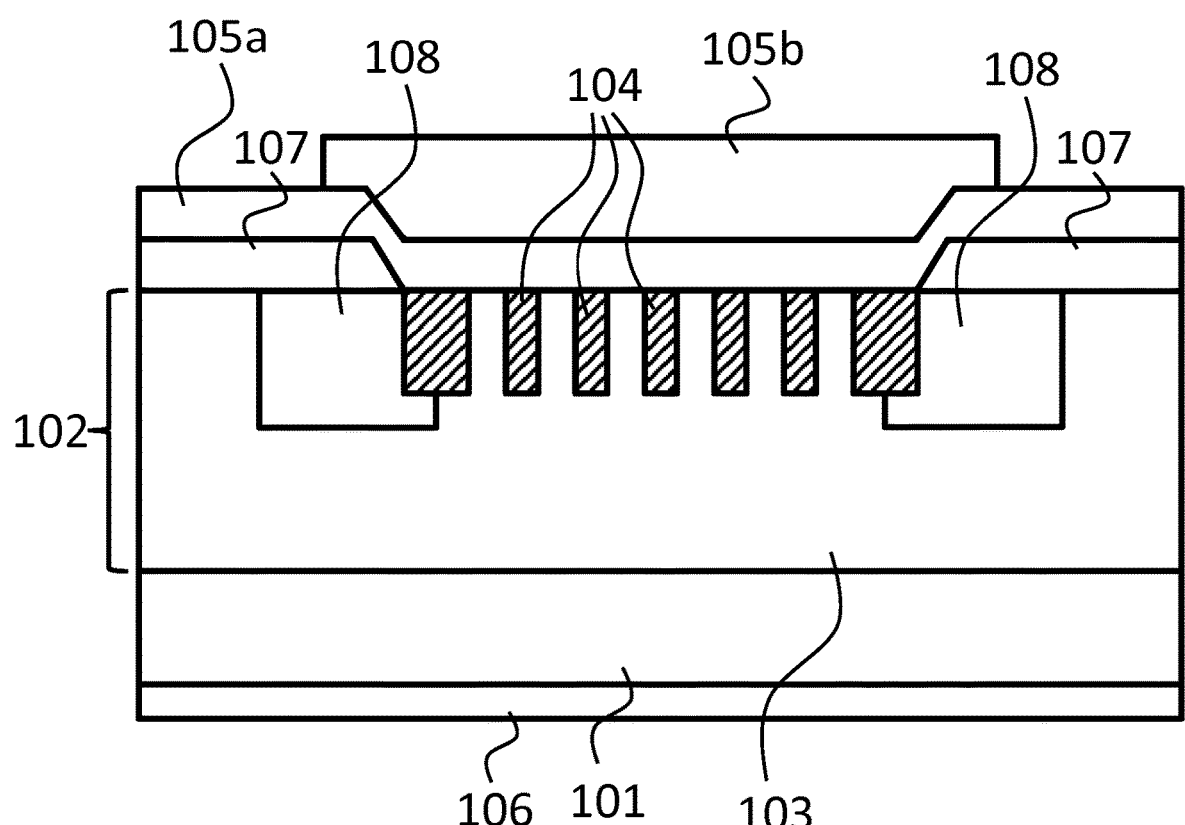

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the detailed description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the detailed description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

Figure 2:
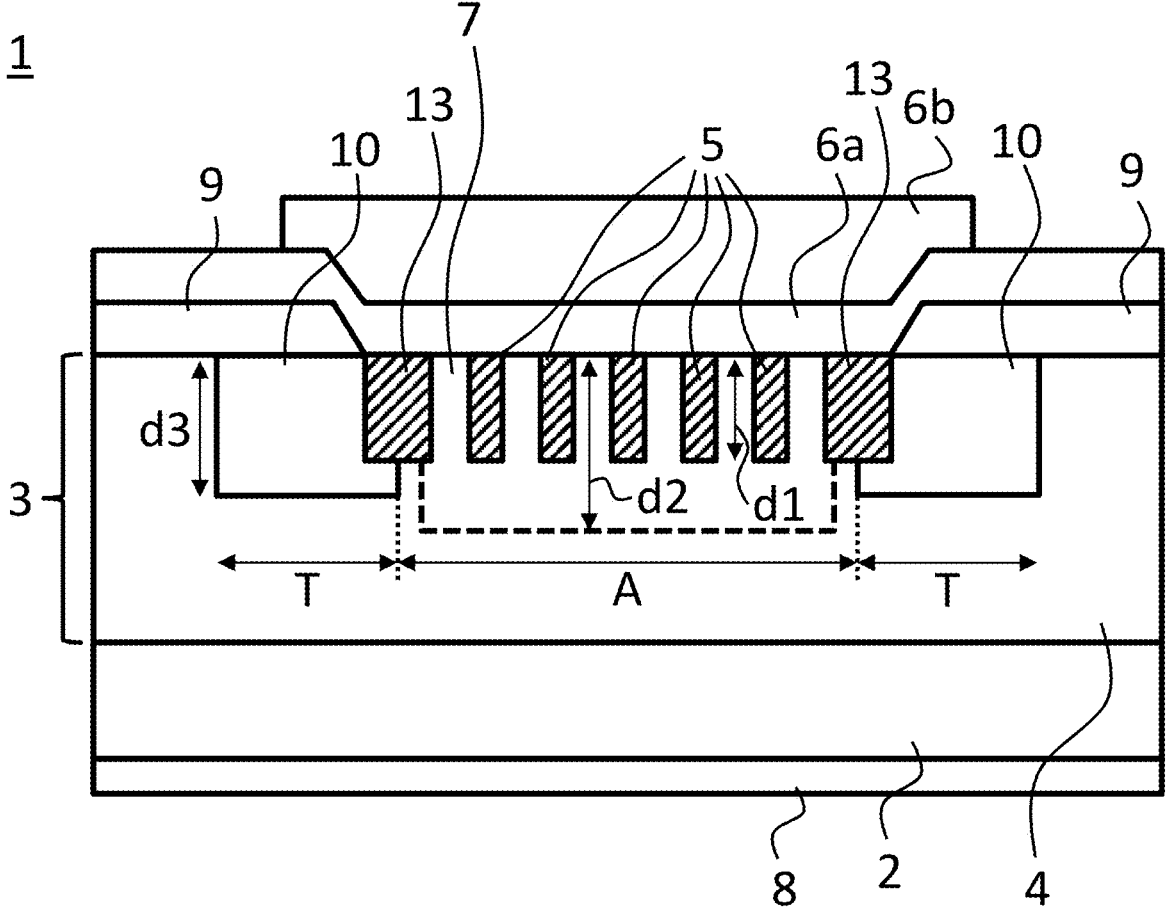
FIG. 2 is a cross-sectional view of an MPS diode in accordance with an embodiment of the present disclosure.

In FIG. 2, a cross-sectional view of an MPS diode 1 is shown in accordance with an embodiment of the present disclosure. MPS diode 1 comprises a substrate 2 having an epitaxial layer 3 formed (e.g., grown) thereon which are included in the semiconductor body of MPS diode 1. Epitaxial layer includes a drift region 4 of a first conductivity type and a plurality of wells 5 of a second conductivity type which form part of an active area A of MPS diode 1. Substrate 2 may have a same conductivity type as drift region 4 and typically has a substantially greater dopant concentration than drift region 4. Within the context of the present disclosure, the first conductivity type may correspond to one of an n-type and p-type doping, whereas the second conductivity type may correspond to another of an n-type and p-type doping.

Although not shown in FIG. 2, the semiconductor body may further comprise a buffer layer in between substrate 2 and epitaxial layer 3, and typically having a dopant concentration in between that of substrate 2 and epitaxial layer 3.

A metal layer assembly is arranged on top of the semiconductor body, comprising a first metal layer 6a and, optionally, a second metal layer 6b. Furthermore, a contact 8 is arranged at a surface of substrate 2 opposite to epitaxial layer 3. The metal layer assembly and contact 8 may form respective terminals of MPS diode 1 that enable external electrical access to the semiconductor body.

First metal layer 6a is arranged to contact drift region 4 and wells 5. In particular, first metal layer 6a forms a plurality of Ohmic contacts with wells 5, and a plurality of Schottky contacts with drift region 4 in between wells 5. To that end, first metal layer 6a may be made of a material or composite material that is suitable for forming said Schottky contacts and Ohmic contacts. Examples of such materials or composites include titanium or titanium nitride for forming the Schottky contacts and a nickel silicon alloy (e.g., nickel monosilicide) for forming the Ohmic contacts, though the present disclosure is not limited thereto.

In some embodiments, a subregion (not shown) can be formed inside wells 5 at the surface of the semiconductor body for the purpose of improving the Ohmic contact with the metal layer assembly. For example, the subregion may comprise a highly doped region having a higher dopant concentration than a remainder of the well 5. A typical dopant concentration for wells 5 may for example be 1e18 cm$^{-3}$, and a dopant concentration of the subregion may be 1e19 cm$^{-3}$ or even 1e20 cm$^{-3}$.

Second metal layer 6b is a top layer of the metal layer assembly in the embodiment shown in FIG. 2 and may thus form an outside contact of MPS diode 1 for external electrical access to first metal layer 6a. Second metal layer 6b may for example be made of aluminum, copper, alloys thereof, or the like, though the present disclosure is not limited thereto. Although two metal layers are shown in FIG. 2, the present disclosure also envisages only having first metal layer 6a, or more than two metal layers which may be composed of the same or different materials with respect to first metal layer 6a and second metal layer 6b.

Contact 8 may form another outside contact of MPS diode 1, and may for example be made of titanium, nickel, silver, alloys thereof, or the like. Although one layer is shown in FIG. 2, in some embodiments, contact 8 may comprise a plurality of layers, i.e., a metal layer stack. For example, contact 8 may comprise a first layer in contact with substrate 2 comprising a nickel silicon alloy, and a second layer in contact with the first layer that comprises titanium, nickel, silver, alloys thereof, or the like.

In drift region 4, a doped region 7 is provided surrounding each of the plurality of wells 5. Here, doped region 7 may at least laterally surround wells 5, e.g., doped region 7 may extend between wells 5 as shown in FIG. 2. Doped region 7 extends from a same surface of the semiconductor body as wells 5 and may extend at least 20% further into the semiconductor body than wells 5, for example 50% or more. For example, wells 5 extend to a first depth d1 in the semiconductor body and doped region 7 extends to a second depth d2 in the semiconductor body, and second depth d2 may be greater than first depth d1. Furthermore, doped region 7 is of the first conductivity type and thus forms a PN junction with each of the plurality of wells 5.

Doped region 7 has a dopant concentration that is greater than that of a remainder of drift region 4. Preferably, the dopant concentration of doped region 7 is at least two times or even at least three times greater than the dopant concentration of the remainder of drift region 4.

MPS diode 1 further includes a termination area T adjacent to active area A and in which a termination region 10 of the second conductivity type may be arranged. Termination area T may be configured to accommodate a relatively high electric field to prevent or limit premature breakdown from occurring in MPS diode 1 along an edge of active area A. Termination region 10 may be electrically insulated from the metal layer assembly by an insulating layer 9 such as an oxide layer. Termination region 10 may be formed to have a closed-loop shape surrounding the active region in the semiconductor body. Termination region 10 may for example have a dopant concentration in a range between $1e17 \text{ cm}^{-3}$-$1e18 \text{ cm}^{-3}$.

Within the context of the present disclosure, active area A may extend between the termination structure in termination area T. In particular, active area A may for example be defined as an area in which a main current-carrying portion of MPS diode 1 is included, in particular wells 5 and Schottky interfaces between the metal layer assembly and the semiconductor body. Termination area T may laterally surround active area A in the semiconductor body and may laterally be defined to begin at a position where the termination structure begins. For example, active area A may be defined to extend between inner edges of the termination structure in termination area T.

By including doped region 7, power dissipation during breakdown of MPS diode 1 can be distributed across at least part of active area A and premature breakdown in termination area T can be limited. Furthermore, doped region 7 is spaced apart from termination area T, and in particular from termination region 10.

In a preferred embodiment, doped region 7 laterally spans less than 98% of active area A, preferably less than 95% of active area A. Active area A may be defined by a portion of the semiconductor body surrounded by termination area T. For example, doped region 7 may occupy a space between inner surfaces of termination region 10 in the semiconductor body. Preferably, the plurality of wells 5 are adjacent to and surrounded by the doped region 7 in the semiconductor body.

Termination region 10 may extend from the same surface of the semiconductor body as wells 5 and doped region 7 and may extend into the semiconductor body to a third depth d3. In a preferred embodiment, second depth d2 is equal to or greater than third depth d3.

Although termination area T in FIG. 2 is shown to include only a single termination region 10, a plurality of termination regions may be used. Various types of termination structures may be used in termination area T instead of the structure shown in FIG. 2, as would be appreciated by the skilled person. For example, instead of a single zone junction termination extension (JTE), a double zone JTE may be used, guard rings at a floating potential, or the like. The present disclosure is not limited to any particular type of termination structure in termination area T.

MPS diode 1 may further comprise an outer well 13 arranged at or near a border between active area A and termination area T. Outer well 13 may be similar to wells 5, e.g., doped similarly to the plurality of wells 5 to have the same charge type and a same or similar dopant concentration. In a further embodiment, outer well 13 may be wider than wells 5 as shown in FIG. 2, though the present application is not limited thereto.

Outer well 13 may support MPS diode operation near the edge of active area A. That is, outer well 13 may, together with an adjacent well 5 and the Schottky contact between first metal layer 6a and drift region 4 or doped region 7, enable MPS diode operation. However, outer well 13 may not be fully laterally surrounded by doped region 7 or may not be arranged adjacent to doped region 7 at all. Instead, doped region 7 may extend between outer well 13 and adjacently arranged wells 5. Alternatively, outer well 13 is not adjacent to doped region 7 and is instead adjacent to a remainder of drift region 4. In that case, in a further embodiment, the MPS diode may include one or more further wells (not shown) that are not surrounded by doped region 7, said further well(s) being arranged between outer well 13 and the plurality of wells 5. For example, the further well(s) may be surrounded fully by a remainder of drift region 4, or may be arranged adjacent to doped region 7 at one or more sides of said further wells, the other side(s) being arranged adjacent to a remainder of drift region 4. Outer well 13 may be provided on either side, and in some embodiments (e.g., when the wells are concentrically arranged) may be a contiguous region.

In the embodiment shown in FIG. 2, outer well 13 may additionally provide an Ohmic contact for termination region 10 to first metal layer 6a, since outer well 13 and termination region 10 have the same charge type. However, since the dopant concentration of outer well 13 will typically be greater than that of termination region 10, the depletion region will not or hardly extend into outer well 13 and it may therefore not or hardly contribute to the termination. Therefore, termination area T corresponds to where termination region 10 starts for the termination structure shown in FIG. 2. The present disclosure is not limited to outer well 13 providing an electrical contact to termination region 10, and this contact may be arranged in another manner instead.

Figure 3:
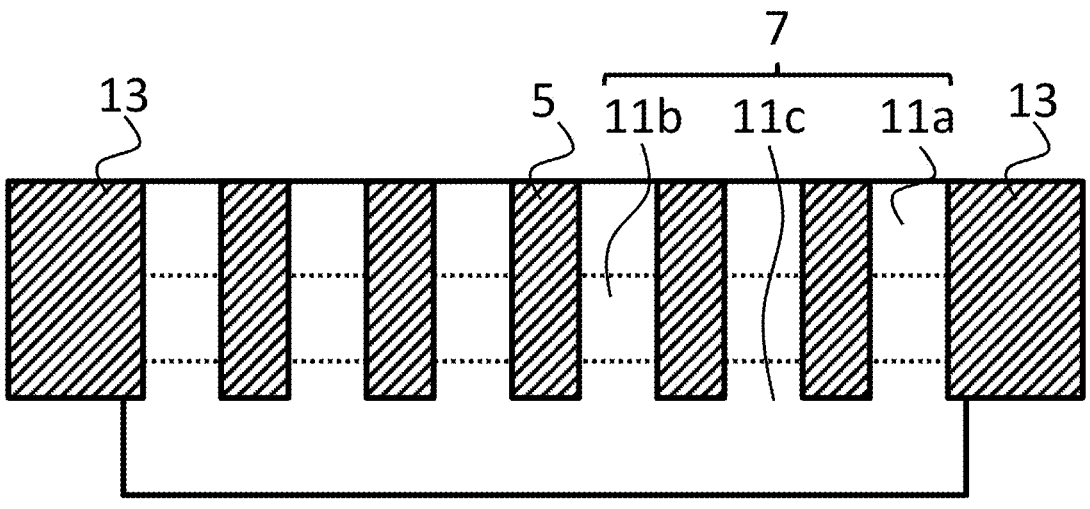
FIGS. 3 and 4 are cross-sectional views of part of an MPS diode in accordance with an embodiment of the present disclosure.

In FIG. 3, a cross-sectional view of part of MPS diode 1 according to an embodiment of the present disclosure is shown. In particular, only wells 5, outer wells 13 and doped region 7 are shown in FIG. 3.

In this embodiment, doped region 7 is formed to have a vertical dopant profile of which the dopant concentration increases from top to bottom in FIG. 3. In particular, doped region 7 may comprise an upper region 11a and a lower region 11c, and optionally a middle region 11b, wherein the dopant concentration of lower region 11c is higher than that of upper region 11a and, if applicable, middle region 11b. In particular, lower region 11c may be a lowermost region of doped region 7, and upper region 11a may be an uppermost region of doped region 7. Although only one middle region 11b is shown in FIG. 3, there may be a plurality of such middle regions in between upper region 11a and lower region 11c, or middle region 11b may be omitted altogether.

The vertical dopant profile of doped region 7 may be employed to mitigate leakage currents in reverse bias. The Applicant has found that a highly suitable configuration is to have lower region 11c extend from between 70-90% of the depth of wells 5 (i.e., first depth d1 in FIG. 2).

In an embodiment, lower region 11c may have a dopant concentration that is at least two times higher than that of upper region 11a, preferably at least three times. For example, lower region 11c, may have a dopant concentration in a range between 6e16-8e16 cm$^{-3}$, and upper region 11a may have a dopant concentration in a range between 2e16-4e16 cm$^{-3}$. Middle region(s) 11b, if present, may have a dopant concentration in between that of upper region 11a and lower region 11c.

The vertical dopant profile of doped region 7 may be formed using a plurality of ion implantation steps, as will be appreciated by the skilled person. For example, a first implantation step is performed to form at least lower region 11c up to a depth of doped region 7, a second implantation step is performed to form at least middle region 11b up to a depth at which lower region 11c should start, and a third implantation step is performed to form at least upper region 11a up to a depth at which middle region 11b should start.

Figure 4:
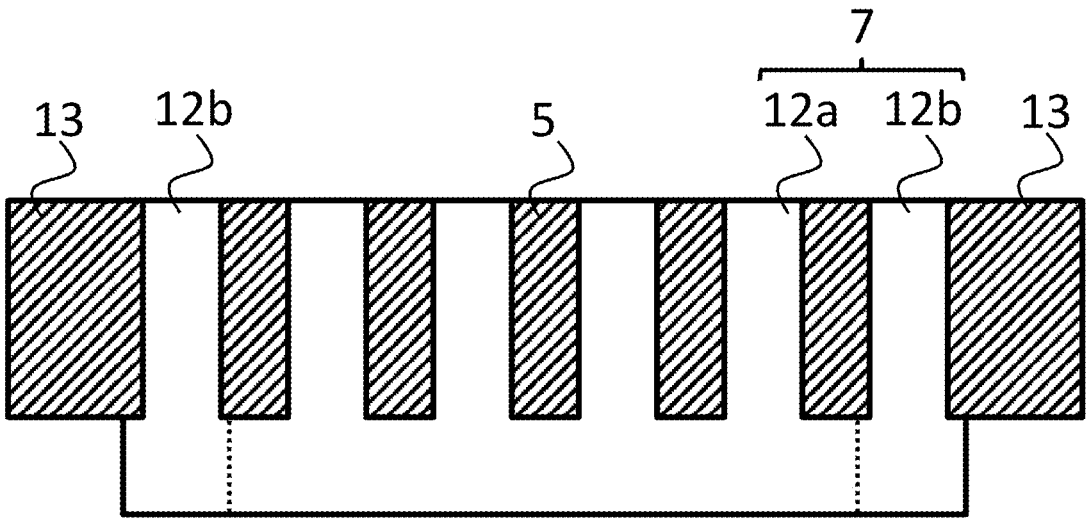

In FIG. 4, a cross-sectional view of part of MPS diode 1 according to an embodiment of the present disclosure is shown. In particular, only wells 5, outer well 13 and doped region 7 are shown in FIG. 4.

In this embodiment, doped region 7 is formed to have a lateral dopant profile of which the dopant concentration decreases from a center of doped region 7 to an edge of doped region 7 in FIG. 3. In particular, doped region 7 may comprise an inner region 12a and an outer region 12b, wherein the dopant concentration of outer region 12b is lower than that of inner region 12a. In particular, inner region 12a may be a center region of doped region 7, and outer region 12b may surround inner region 12a. Preferably, inner region 12a corresponds to between 10-90% of doped region 7, preferably 90%, whereas outer region 12b forms a remainder of doped region 7.

In an embodiment, outer region 12b may have a sloped dopant profile. For example a dopant concentration of outer region 12b decreases from the dopant concentration of inner region 12a directly adjacent to inner region 12a to a dopant concentration lower than that of inner region 12a at the edge of doped region 7. Preferably, at the edge of doped region 7, the dopant concentration is substantially equal to that of a remainder of drift region 4.

The lateral dopant profile of doped region 7 may be formed using an ion implantation step, as will be appreciated by the skilled person. To form outer region 12b as described above, a mask layer (not shown) with variable thickness may be used. For example, the mask layer may be provided and patterned in accordance with a desired shape of doped region 7. Furthermore, such a mask layer may have a sloped portion above an area corresponding to where outer region 12b is to be formed, such that after the implantation step the dopant concentration formed under said sloped portion has a lower dopant concentration than an exposed portion corresponding to inner region 12a.

Instead of a sloped dopant profile, outer region 12b may have a substantially uniform dopant concentration that is lower than that of inner region 12a. In another embodiment, outer region 12b may comprise a plurality of subregions arranged between inner region 12a and the edge of doped region 12b, said subregions each having a substantially uniform dopant concentration, wherein a dopant concentration of subregions closer to the edge of doped region 7 is less than the dopant concentration of subregions farther from the edge of doped region 7.

In an example, inner region 12a may have a dopant concentration in a range between 3e16-8e16 cm$^{-3}$, and outer region 12b may have a dopant concentration in a range between 1e16-3e16 cm$^{-3}$.

The embodiments shown in FIG. 3 and FIG. 4 may be combined. That is, although doped region 7 is described to have a vertical dopant profile with reference to FIG. 3 and a lateral dopant profile with reference to FIG. 4, a combination thereof is also envisaged by the present application.

For example, with reference to FIG. 4, inner region 12a may have a vertical dopant profile in accordance with the embodiment described with reference to FIG. 3. Optionally, outer region 12b may also have a vertical dopant profile as described with reference to FIG. 3. In doing so, negative effects on MPS diode 1 from both leakage currents and electric field during breakdown can be mitigated.

In the embodiments described above, wells 5 may have various configurations. For example, wells 5 may be formed as parallel strips spaced apart in a first direction and elongated in a second direction perpendicular to said first direction. In another example, wells 5 may be formed as concentric shapes such as elliptical or polygonal shapes. In yet another example, wells 5 may be formed as islands that are distributed two-dimensionally, that is, spaced apart in the first direction and in the second direction. However, the present disclosure is not limited to any particular configuration of wells 5.

A manufacturing method for MPS diode 1 may be as follows. First, a semiconductor body is provided, for example substrate 2 on which epitaxial layer 3 is grown. Epitaxial layer 3 may comprise or define drift region 4 of the first conductivity type. Doped region 7 may be implanted in the semiconductor body, in particular epitaxial layer 3, using one or more mask layers as described above, the mask layer being patterned to form a desired shape and position of doped region 7. In particular, doped region 7 After the implantation step(s), said mask layer can be removed again. Wells 5 and, if applicable, further wells and/or outer wells 5a may be provided via another implantation step using another patterned mask layer defining a desired shape and position of wells 5 and, if applicable, further wells and/or outer wells 5a, and the another patterned mask layer may be removed again after the another implantation step. After that, the metal layer assembly can be arranged on top of the semiconductor body. Contact 8 may be provided with the semiconductor body or arranged subsequently to any of the above described steps. The method may also include, prior to arranging the metal layer assembly, forming termination region 10 via an yet another implantation step using yet another patterned mask layer defining a desired shape and position of termination region 10, as well as arranging insulating layer 9 on top of part of the semiconductor body for electrically insulating the metal layer assembly from termination region 10.

Further steps may be included, such as providing a buffer layer between substrate 2 and epitaxial layer 3, providing passivation layers covering part of the metal layer assembly, or the like, as will be appreciated by the skilled person.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including various modifications and/or combinations of features from different embodiments, without departing from the scope of the present disclosure as defined by the appended claims.

What is claimed is:

1. A merged PiN Schottky (MPS) diode, comprising:
a semiconductor body including an active area and a termination area adjacent to the active area, wherein the active area comprises:
a drift region of a first conductivity type; and
a plurality of wells of a second conductivity type different from the first conductivity type, wherein the plurality of wells being mutually spaced apart, each well forming a respective PN-junction with the drift region;
a metal layer assembly arranged on a surface of the semiconductor body and comprising at least one metal layer, wherein the metal layer assembly form a plurality of Schottky contacts together with the drift region and a plurality of respective Ohmic contacts with the plurality of wells;
wherein the drift region comprises a doped region surrounding each of the plurality of wells and has a higher dopant concentration than a remainder of the drift region, and wherein the doped region is spaced apart from the termination area; and
wherein from the surface in a direction perpendicular to the surface, the dopant concentration of the doped region increases, and wherein the doped region includes a substantially uniformly doped upper region and a substantially uniformly doped lower region below the upper region; and/or
wherein the doped region comprises an inner region and an outer region laterally adjacent to the inner region, and wherein the outer region has a lower dopant concentration than the inner region.

2. The MPS diode according to claim 1, wherein the doped region includes the upper region and the lower region, and wherein the lower region extends from between 70% and 90% of a depth of the plurality of wells to a depth of the doped region.

3. The MPS diode according to claim 1, wherein the doped region includes the upper region and the lower region, and wherein the lower region has a dopant concentration that is at least two times higher than a dopant concentration of the upper region.

4. The MPS diode according to claim 1, wherein the doped region includes the upper region and the lower region, and wherein the doped region further includes one or more substantially uniformly doped middle regions arranged between the upper region and the lower region and has a dopant concentration between that of the upper region and the lower region.

5. The MPS diode according to claim 1, wherein the doped region extends laterally in at most 98% of the active area.

6. The MPS diode according to claim 1, wherein the doped region comprises the inner region and the outer region, and wherein the outer region has a sloped dopant profile in an outward direction from a center of the doped region.

7. The MPS diode according to claim 1, wherein the doped region comprises the inner region and the outer region, and wherein the inner region has a dopant concentration that is at least two times higher than a dopant concentration of the outer region.

8. The MPS diode according to claim 1, wherein the dopant concentration of the doped region is at least two times greater than the dopant concentration of the remainder of the drift region.

9. The MPS diode according to claim 1, wherein each pair of adjacently arranged wells among the plurality of wells has a spacing therebetween and the dopant concentration of the doped region is selected so that, at breakdown, an electrical field strength at an interface between the metal layer assembly and the drift region is below 70% of an electrical field strength at the PN junctions between the plurality of wells and the drift region.

10. The MPS diode according to claim 1, wherein the semiconductor body comprises a substrate and an epitaxial layer arranged on the substrate, wherein the active area and the termination area are arranged in the epitaxial layer, wherein the metal layer assembly forms a first terminal of the MPS diode, wherein the MPS diode further comprises a contact arranged on the substrate, and wherein the contact forms a second terminal of the MPS diode.

11. The MPS diode according to claim 1, wherein the plurality of wells are formed as parallel strips or as concentric shapes; and/or wherein each of the plurality of wells further comprises a subregion at the surface of the semiconductor body, wherein the subregion has a higher dopant concentration than a remainder of the well for enabling an Ohmic contact with the metal layer assembly and/or the subregion.

12. The MPS diode according to claim 1, wherein the termination area comprises a termination region of the second conductivity type extending from the surface to a third depth in the semiconductor body, and wherein the second depth is equal to or greater than the third depth.

13. The MPS diode according to claim 12, wherein the plurality of wells has a dopant concentration that is at least 10 times greater than a dopant concentration of the termination region.

14. The MPS diode according to claim 1, wherein the plurality of wells extend from the surface to a first depth into the semiconductor body, wherein the doped region extends from the surface to a second depth into the semiconductor body, and wherein the second depth is at least 20% greater than the first depth.

15. The MPS diode according to claim 14, wherein the termination area comprises a termination region of the second conductivity type extending from the surface to a third depth in the semiconductor body, and wherein the second depth is equal to or greater than the third depth.

16. The MPS diode according to claim 14, wherein the doped region includes the upper region and the lower region, and wherein the lower region extends from between 70% and 90% of a depth of the plurality of wells to a depth of the doped region.

17. The MPS diode according to claim 14, wherein the doped region includes the upper region and the lower region, and wherein the lower region has a dopant concentration that is at least two times higher than a dopant concentration of the upper region.

18. The MPS diode according to claim 14, wherein the doped region includes the upper region and the lower region, and wherein the doped region further includes one or more substantially uniformly doped middle regions arranged between the upper region and the lower region and has a dopant concentration between that of the upper region and the lower region.

19. The MPS diode according to claim 14, wherein the doped region extends laterally in at most 98% of the active area.

20. A method for manufacturing a merged-PiN Schottky (MPS) diode, comprising:

providing a semiconductor body including an active area and a termination area adjacent to the active area, wherein the active area comprises a drift region of a first conductivity type;

forming a doped region in the drift region, the doped region having a higher dopant concentration than a remainder of the drift region, wherein the doped region is spaced apart from the termination area;

forming a plurality of wells of a second conductivity type different from the first conductivity type in the doped region, wherein the plurality of wells being mutually spaced apart, with each well forming a respective PN-junction with the drift region;

arranging a metal layer assembly on the surface, wherein the metal layer assembly comprising at least one metal layer, wherein the metal layer assembly forms a plurality of Schottky contacts together with the drift region and a plurality of respective Ohmic contacts with the plurality of wells; and wherein from the surface in the direction perpendicular to the surface, the dopant concentration of the doped region increases, wherein the doped region includes a substantially uniformly doped upper region and a substantially uniformly doped lower region below the upper region; and/or wherein the doped region comprises an inner region and an outer region laterally adjacent to the inner region, and wherein the outer region has a lower dopant concentration than the inner region.

* * * * *